United States Patent [19]
Hillstrom

[11] Patent Number: 5,337,339
[45] Date of Patent: Aug. 9, 1994

[54] HIGH FREQUENCY PROGRAMMABLE DIVIDER

[75] Inventor: Timothy L. Hillstrom, Lake Stevens, Wash.

[73] Assignee: Hewlett-Packard Company, Palo Alto, Calif.

[21] Appl. No.: 963,303

[22] Filed: Oct. 15, 1992

[51] Int. Cl.$^5$ .............................................. H03K 23/66
[52] U.S. Cl. ......................................... 377/52; 377/54
[58] Field of Search ...................................... 377/52, 54

[56]  References Cited

U.S. PATENT DOCUMENTS 5,221,906  6/1993  Hayashi et al. ........................ 377/54

OTHER PUBLICATIONS

ECLinPS data manual 1990; Motorola Inc, Phoenix Ariz.
"Digital Phase Locked Loops: Theory & Design" pp. 276–281, Ulrich L. Rohde, Prentice-Hall 1983.
"The Art of Electronics", 2nd Ed., pp. 545–546; Paul Horowitz & Winfield Hill, Cambridge Press 1989.

Primary Examiner—Margaret Rose Wambach

[57] ABSTRACT

A high speed, synchronous, programmable frequency divider is disclosed. The divider is composed of a cascade of conventional programmable counters, each of which receives some portion of an externally supplied integer N, such that the divider produces one output pulse for every N periods of a supplied clock signal. Although conventional frequency dividers are substantially slower than the speed of their individual counters, a divider according to this invention, however, will operate at very nearly the same speed. The improved performance is achieved through (a) individually choosing the timing of the clock signal applied to each circuit of the divider, and (b) introducing a delay circuit, typically a shift register, in a feedback path. A method for determining the values of the clock timing variations and for determining an optimum number of flip-flops in the shift register is given. A divider according to the invention may be optimized either for maximum speed or for best design margins at a given speed.

9 Claims, 5 Drawing Sheets

HIGH FREQUENCY PROGRAMMABLE DIVIDER

FIELD OF THE INVENTION

This invention pertains to electronic dividers and, in particular, to synchronous high speed dividers composed of cascaded, programmable counter circuits.

BACKGROUND AND PRIOR ART

In the art of frequency synthesis, there arises a need for a frequency divider which can divide by an arbitrary number, chosen and programmed into the divider by the user. This need is due to the prevalence of phase locked loops in the synthesis art. In these loops, the output signal of a voltage-controlled oscillator (VCO) is divided by such a programmable divider. The divider's output pulse train is then compared with a reference frequency signal and the phase difference of the two is converted into a control signal which is then applied to the VCO. Using negative feedback and proper design of the loop parameters, this will result in stabilizing the value of the phase difference and locking (that is, holding constant) the VCO frequency. If the divider can be programmed to divide by an arbitrary integer N, the VCO will thus be locked to N times the reference frequency. Hence, varying the value of N will make available a range of synthesized signals from the VCO.

To build frequency dividers, it is common in the art to rely on programmable counter integrated circuits (ICs). These are available in both binary and decimal formats and with many different feature combinations. For many applications, a divider may readily be constructed by using programmable counters, either singly or in combination. A typical divider is composed of cascaded (i.e., chained together) counter ICs in sufficient number to accomodate the largest value of N required. Each IC is responsible for one digit (decimal counter) or 4 or more bits (binary counter). FIG. 1 shows an example of how to construct a frequency divider for dividing a signal frequency of 20 MHz by a decimal integer from 2 to 1000. Three binary-coded-decimal (BCD) programmable counter ICs 10, 11, 12 are connected in cascade. The signal to be divided is supplied in the form of a logic clock 13 coupled to the clock inputs 14. Each counter has a count enable input (CE) which must be high (asserted) to enable counting, a terminal count (TC) output which becomes high when the internal count reaches nine, and a program enable input (PE) for enabling a BCD number to be loaded into its internal registers. Because these counters count up, the complement of N (1000-N) is made available and is partitioned into units, tens, and hundreds components which are supplied to the program inputs 21, 22, and 23, respectively. CE 25 is always enabled, so the units counter 10 counts continually. Each time its contents reach nine, TC output 16 becomes high for one clock cycle, falling to zero as the counter's contents transition from nine to zero. The coupling from TC 16 to CE 19 enables the tens counter 11 to advance one count on the next clock cycle. Similiar control is exercised by counter 11 on the hundreds counter 12 by connecting TC 17 to CE 20. When the maximum count value 999 is reached, TC 18 becomes high and, by asserting all PE inputs 15, causes each counter to reload the digit at its programming input and thus the divider begins a new cycle. TC 18 also is the source of the divider output signal 24.

A typical choice for the counter IC is the 74LS162, a TTL part specified to have a count rate of at least 25 MHz.

It would surprise some builders of this divider, however, to discover that its maximum speed is much less than 25 MHz. This reduced performance is caused by the additional times required by the interconnections among the counters. The critical event for the divider is the transition after the maximum count is reached. In addition to the clock-TC delay (35 nS), the circuit must accomodate two CE setup times (40 nS) and a PE setup (20 nS), for a total of 95 nS. This corresponds to a maximum frequency for the divider of 1/(95 nS) or 10.5 Mhz:

One way to realize a higher speed programmable divider is to choose a faster logic family, such as ECL. This will increase the speed by a factor of 5 or more over the TTL version, but there are several penalties: higher cost, greater power consumption, logic level translation to other circuits, and another power supply. In addition, the maximum frequency of a cascaded ECL divider is lower than that of its individual counters, and for the same reason: additional times required by the interconnections.

Another way to build programmable dividers to operate at higher speeds is to use a dual-modulus counter. This device is a high speed counter whose modulus can be switched between two numbers, such 10 and 11, by a single control line. It has a disadvantage of requiring an additional control counter to determine when to switch the modulus. It has a more serious disadvantage in that there are certain values of N which cannot be used. An illuminating discussion of dual modulus dividers is found in "Digital phase locked loops: theory and design" by Ulrich L. Rohde, Prentice-Hall 1983, pages 276ff.

For those requiring a programmable divider to operate near the high frequency end of the art, currently approaching a gigahertz, the options are few. Accordingly, there is a need for achieving higher frequency performance from divider circuits composed of commercially available counter ICs.

SUMMARY OF THE INVENTION

In accordance with the preferred embodiment of the invention, a programmable, synchronous frequency divider is described, comprising two cascaded programmable counters and a shift register. The maximum speed of the divider approaches that specified for the individual counters.

Among the principles disclosed in the preferred embodiment are a) delaying the program enable signal supplied to the least significant counter
b) controlling arrival times of the clock signals to each counter and flip-flop
c) a methodology for choosing the clock signal arrival times and the number of flip-flop circuits for maximizing performance according to either of two criteria.

One aspect of the present invention uses a shift register, composed of one or more flip-flop circuits, to delay the terminal count signal fed back to the least significant counter.

Another aspect of the invention concerns the distribution of clock signals to the several circuits composing the divider. (A divider, such as in the preferred embodiment, counts cycles of the clock signal.) In conventional high frequency digital design, much care is taken to minimize clock "skew" or non-simultaneous application of the edges of the clock waveform to various elements of the circuit. In this aspect, however, clock skew is deliberately introduced as a design parameter to increase the speed of the divider. In general, the highest speed is achieved with non-simultaneous clock edges applied to the flip-flop circuits as well as to the counters.

In yet another aspect of the invention, a method is introduced for determining the relative skew of the clock edges in order to optimize the performance of the divider. Based on circuit models, a set of inequality relationships among various inter- and intra-element time delays is derived. This set is manipulated by hand or computer to determine the best skew values. The method also evaluates the design tradeoffs in choosing the number of flip-flop circuits in the terminal count feedback path.

At least two different criteria for optimization may be chosen: one may maximize the clock frequency; or, given a desired clock frequency, maximize the design margins for it. These criteria lead, in general, to different values of clock skew.

LIST OF DRAWINGS

DETAILED DESCRIPTION

According to the disclosure of the invention, a synchronous frequency divider composed of cascaded programmable counters may be constructed to divide an applied clock signal, producing one output pulse for every N input cycles from the clock. The choice of the integer N is determined by the application of the divider and usually can be varied. N (or its complement) is supplied as an external programming signal.

Figure 1:
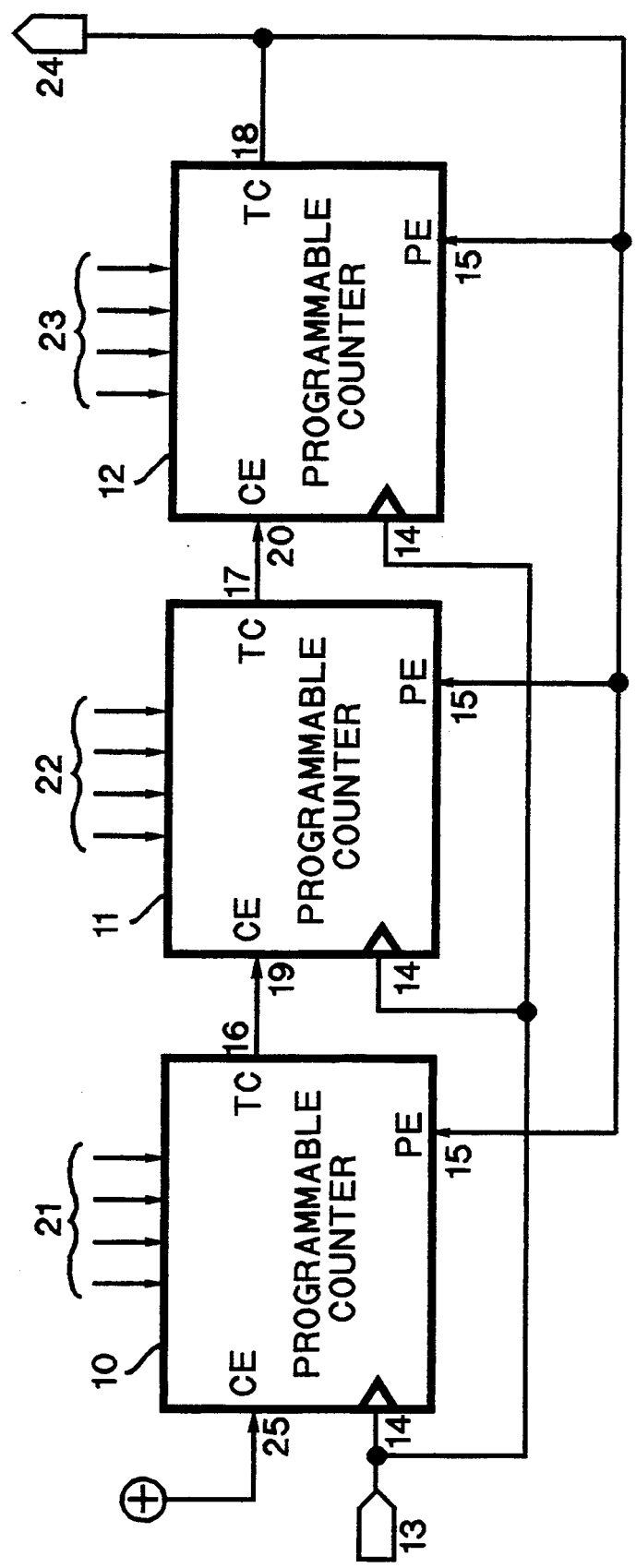
FIG. 1 is a block diagram of a prior-art programmable frequency divider.
Figure 2:
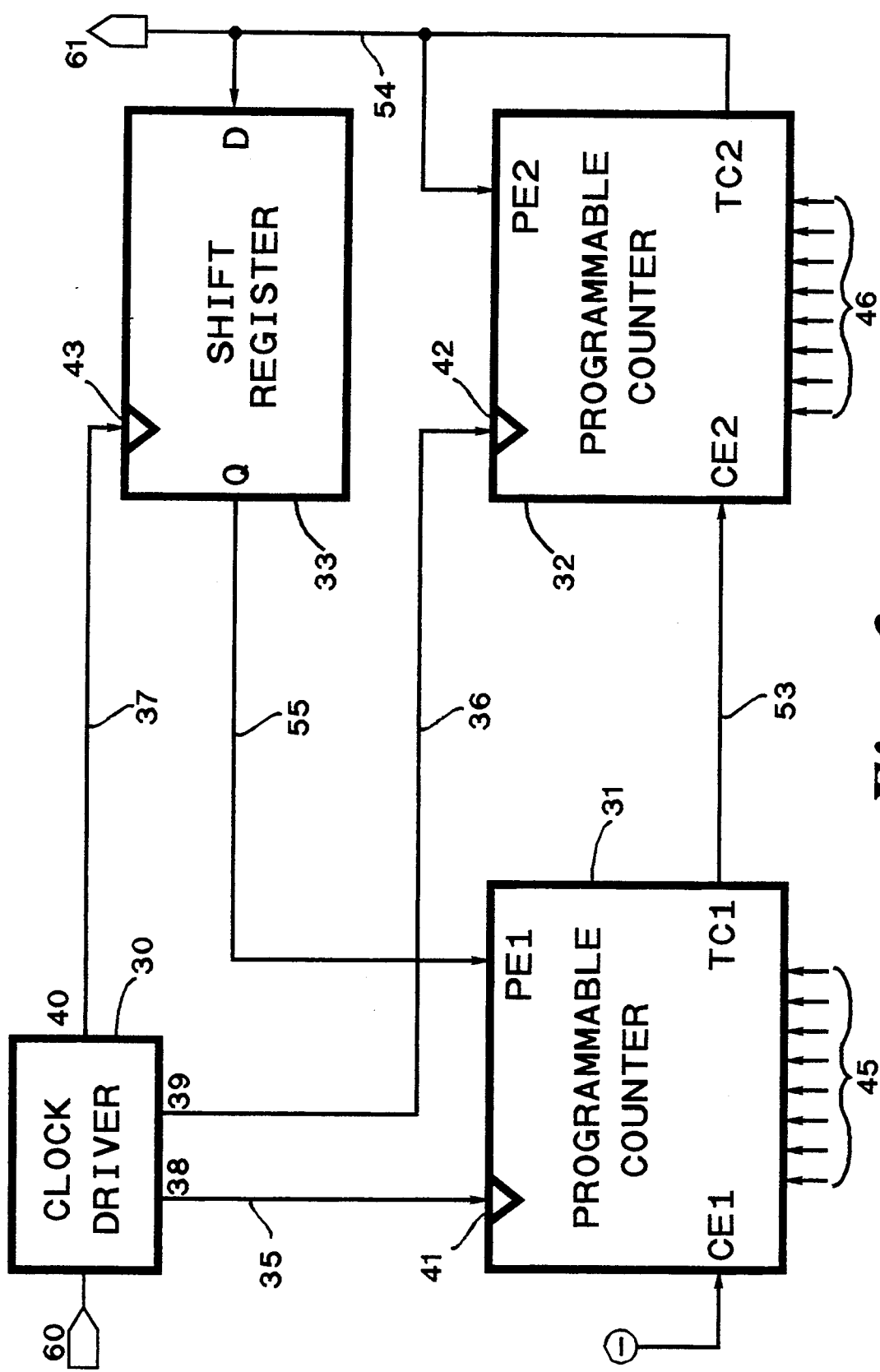
FIG. 2 is a block diagram of the preferred embodiment.

The preferred embodiment of the present invention is a 16 bit, high speed divider, as shown in FIG. 2. The divider operates up to 650 MHz, and divides the incoming clock frequency by an integer N, expressed as a binary number. N may be any integer up to a maximum of about 40,000. In the figure, 31 and 32 are 8-bit ECL programmable counters having a maximum speed of at least 700 MHz. Shift register 33 consists of a single ECL D flip-flop. The ECL clock driver 30 has multiple outputs; it is specified to have very low differential time delay (or "skew") among the outputs. Appropriate parts for the divider include the Motorola MC10E111 clock driver, the MC10E016 counter and the MC10E131 quad D flip-flop.

It is necessary to use cascaded counters, as shown in FIG. 2, because the maximum count value of a single counter - $2^8$ - is much less than the maximum value of N. As explained earlier, when more than one counter is cascaded to form a divider circuit, the maximum clock frequency of the combination is reduced. In this case, the additional time delays required by control signals and the like, plus variations in printed circuit layout could well result in the divider's not operating above 500 MHz. This reduction in speed a phenomenon well-known in the art, and is discussed in numerous publications. Among these are the Motorola ECLinPS data manual (see under the MC10E016 part, page 3–6) and the popular text "The Art of Electronics" 2nd edition, by Horowitz & Hill, pages 545 & 546.

The preferred embodiment of the invention illustrated in FIG. 2 restores the speed of the cascaded counters nearly to that of a single counter.

Figure 3:
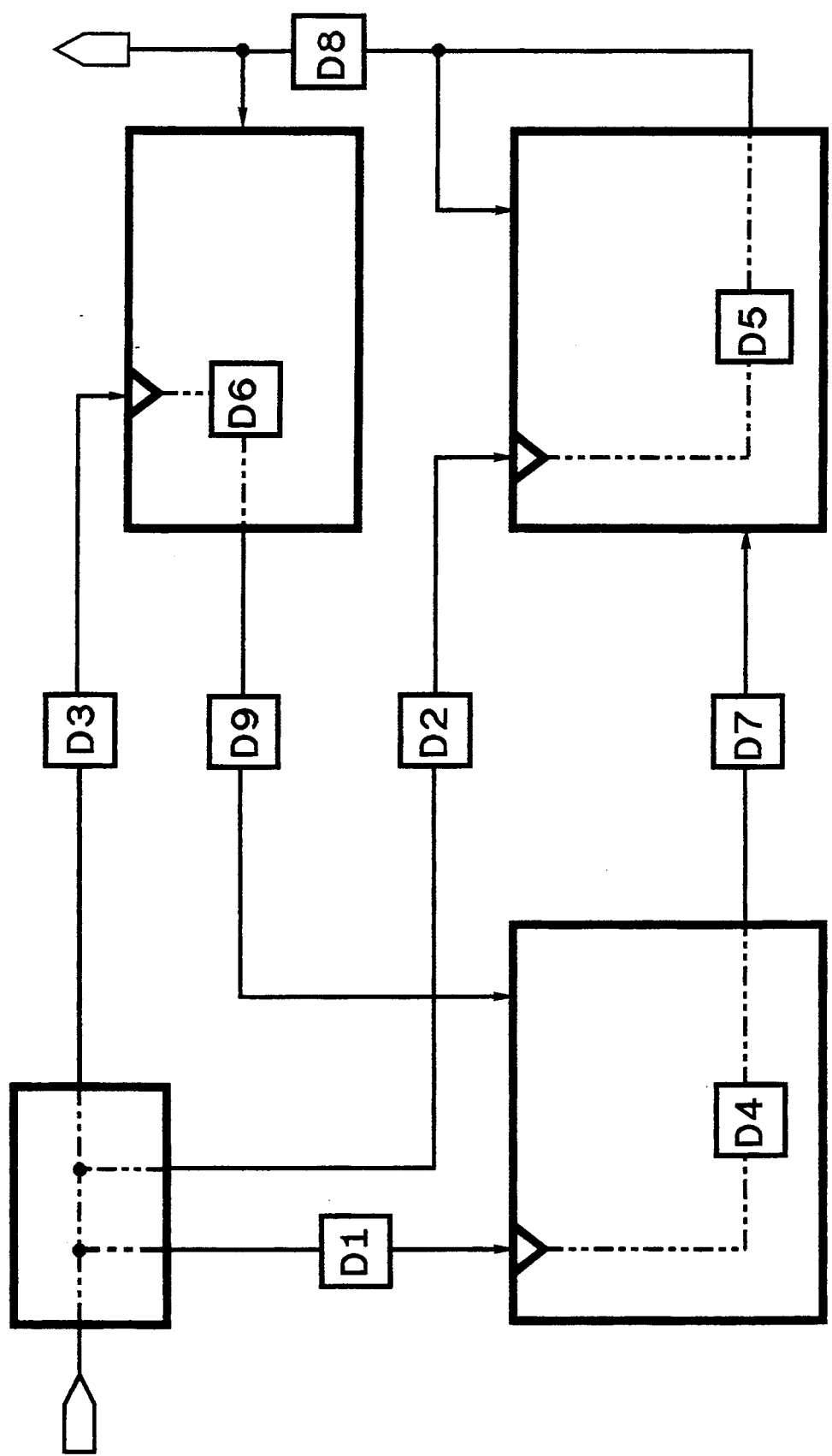
FIG. 3 is a block diagram identifying various time delays associated with the elements of FIG. 2 and their interconnections.

Referring to both FIGS. 2 and 3, the operation of the illustrated circuit is now explained. Clock driver 30 receives the clock signal 60 at its input. Its outputs 38, 39, and 40 are essentially identical, synchronous ECL signals. These signals are delivered to the clock inputs on counters 31 and 32 and shift register 33 via printed circuit traces 35, 36, and 37. The relative arrival times of the three clock signals depend on propagation delays in traces 35, 36, and 37. The length of the traces is purposefully chosen, as later explained; that is, skewing among the delivered clock signals is deliberately introduced as a design variable. These trace delays are designated D1, D2, and D3, respectively.

A complete divider cycle begins with counters 31 and 32 programmed by data at their inputs 45 and 46, respectively. Because counters 31 and 32 count up, they are programmed with the complement of N ($2^{16}$ - N) ; this number is then partitioned, with counter 31 receiving the least- and counter 32 the most-significant portions. As CE1 (active low) is always enabled, counter 31 then proceeds to increment its count until its maximum value ($2^8$) is reached. At this time, the terminal count signal TC1 is asserted and is propagated, via trace 53, to input CE2 of counter 32. Because CE2 is only high for one clock cycle, counter 32 advances just one count. Subsequently, counter 32 advances one count for every complete counting cycle ($2^8$ clock cycles) of counter 31. When counter 32 reaches its terminal count (also $2^8$), signal TC2 is asserted and is propagated, via trace 54, to the D input of shift register 33. TC2 also is connected to program enable PE2, causing counter 32 to load the data at its program input 46 again. Because CE2 is then low, counter 32 remains quiescent for a time. Meanwhile, signal TC2, delayed one clock cycle by shift register 33, is propagated, via output Q and trace 55, to input PE1. Thus, counter 31 is re-programmed with the data at input 45, and the complete divide cycle begins again.

Since signal TC2 is delayed one clock period by shift register 33, an extra count occurs in the division cycle. Thus, in order to achieve the desired division by N, the dividing modulus should be the complement of N−1.

The inter-IC delays D7, D8, and D9 (FIG. 3) consist of trace propagation times plus any RC time-constant delays due to driver output resistance and trace capacitance. Although minimized by careful layout, these delays are not negligible and must be accounted for in a maximum performance design.

D4, D5, and D6 represent clock-to-output delays of the respective ICs.

To attain maximum speed in the present embodiment, a small sacrifice in the maximum value of N has been made. When counters 31 and 32 are cascaded in the customary manner, the program enable signal is formed as the logical AND of TC1 and TC2. Here, only TC2 is used, which saves a gate delay but decreases the maximum N to $2^{16}-2^8$.

Various relationships among all these quantities will now be studied to determine the time relationships for best high speed performance. The criterion underlying the discussion will be to develop the widest design margin, given a specific maximum clock frequency to be accomodated. However, an alternative goal is to design for maximum possible clock frequency, and a method for applying that criterion will be outlined.

Figure 4:
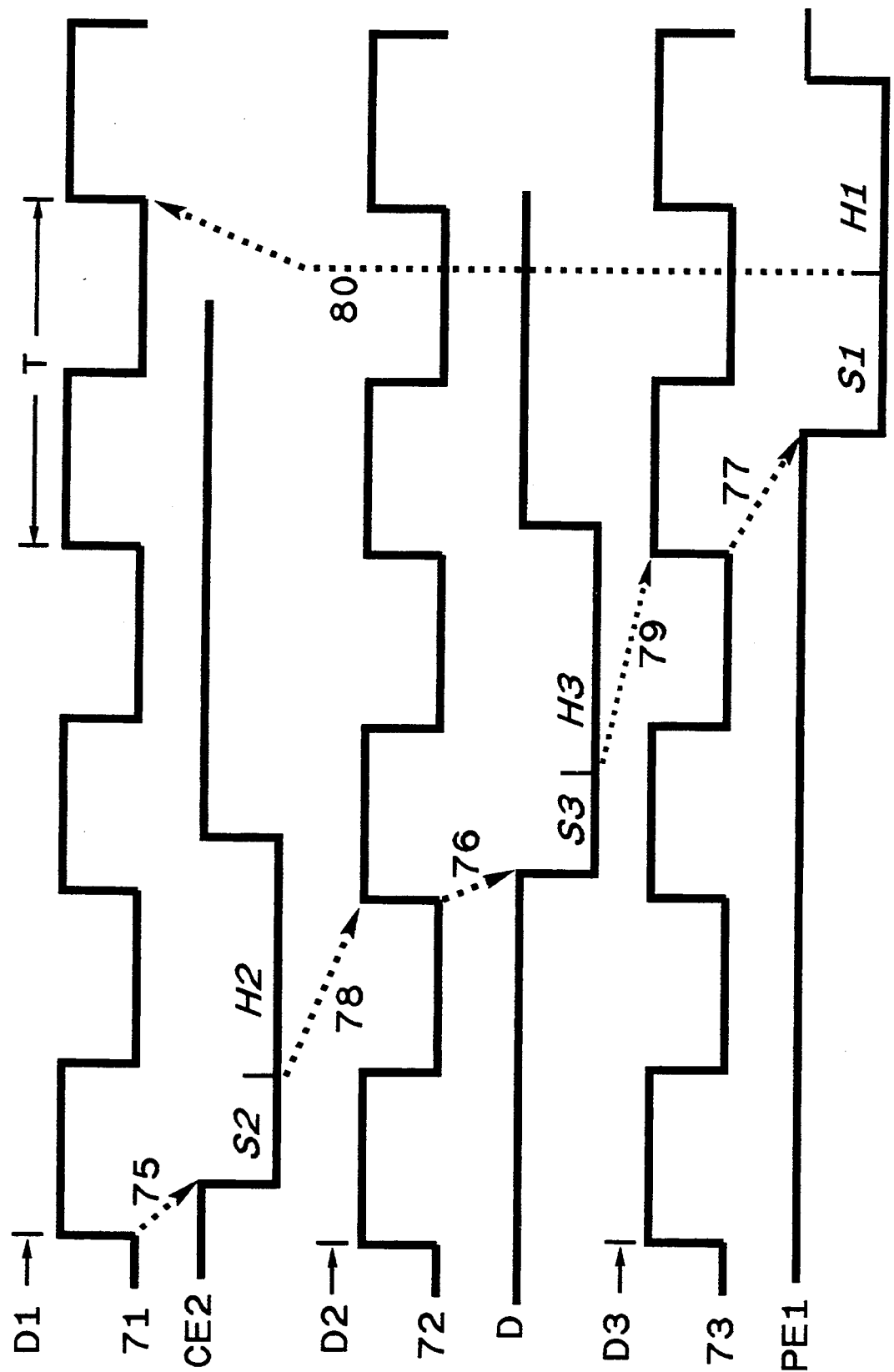
FIG. 4 is a timing diagram illustrating time relationships among various signal waveforms existing in the preferred embodiment represented in FIG. 2.

FIG. 4 is a timing diagram of the circuit of FIG. 2, showing the principal waveforms and indicating relations among them.

Three waveforms 71, 72, and 73 represent the signals at the clock inputs 41, 42, and 43, respectively. D1, D2, and D3 represent the time delays of the clock edges, with respect to the clock driver 30. For design purposes, these Ds will later be converted to differential times $T_{ij}$ among the clocks. Although for drawing simplicity these waveforms are shown in phase in FIG. 4, in general the edges are not simultaneous; their actual time relations derive from the analysis to follow. The period T of the clock is indicated on waveform 71.

The three waveforms CE2, D, and PE1 represent the signals at those inputs, respectively. (Note: this D is not a time delay, but a conventional name for a type of flip-flop.) These signals are active low, and their active regions are partitioned into the setup times (S1, S2, S3) and hold times (H1, H2, H3) specified for those inputs.

The dotted lines 75–80 indicate precedence relations. Lines 75, 76, and 77 show clock-to-output precedence; for instance, the falling edge of CE2 is caused by clock waveform 71, which precedes it by D4+D7 seconds (see FIG. 3). Lines 78, 79, and 80 show input-to-clock precedence. For example, signal CE2 must precede clock 72 by at least S2 seconds and remain valid after it by at least H2 seconds. These precedence requirements—imposed by the devices and the physical construction—must be met at the highest clock frequency of use. If the precedence requirements are met with some time to spare, then that time becomes a design margin, assuring correct operation of the counter over some range of device parameters.

Manufacturer's specifications for setup and hold times are given as lower bounds; that is, the signal applied to an input must meet or exceed (by any amount) these times. However, internal device delays D4, D5, and D6 fall in a range defined by specified minimum and maximum values; the appropriate minimum or maximum values are used in the expressions which follow.

A design model may now be formalized by defining the conditions for meeting the minimum setup and hold requirements in terms of all the parameters. This leads to the following 6 inequalities, one for each S and H:

S2: $D2+T-(D1+D4_{max}+D7)>S2$ (1)

H2: $D1+T+D4_{min}+D7-(D2+T)>H2$ (2)

S3: $D3+2T-(D2+T+D5_{max}+D8)>S3$ (3)

H3: $D2+2T+D5_{min}+D8-(D3+2T)>H3$ (4)

S1: $D1+3T-(D3+2T+D6_{max}+D9)>S1$ (5)

H1: $D3+3T+D6_{min}+D9-(D1+3T)>H1$ (6)

Combining these inequalities by pairs, and converting to differential times (skew) among the clocks by substituting $T_{ij}=D_i-D_j$ three double inequalities may be derived:

$S2+D4_{max}+D7-T<T21<D4_{min}+D7-H2$ (7)

$S3+D5_{max}+D8-T<T32<D5_{min}+D8-H3$ (8)

$S1+D6_{max}+D9-T<T13<D6_{min}+D9-H1$ (9)

Since every quantity in these expressions is known except the $T_{ij}$, the effect is to subject the $T_{ij}$ to upper and lower bounds which must be satisfied simultaneously. The task, then, is to choose the $T_{ij}$ so that they lie as far as possible from the bounds, thus maximizing design margins; that is, providing the best protection against variation of component parameter values.

Note that only two of the $T_{ij}$ are independent: $T_{13}=-(T_{21}+T_{32})$.

A numerical example will assist in understanding this procedure.

Assume the following data, representative of the ECL parts used in the preferred embodiment (times are in picoseconds):

$S1=S2=600$ $S3=150$ $H1=H2=0$ $H3=175$ $D4_{min}=D5_{min}=550$ $D4^{min}=D5_{max}=900$ $D6_{min}=360$ $D6_{max}=700$ $D7=60$ $D8=100$ $D9=70$ $T=1/F_{clock}=1/650Mhz=1538$ Applying these data to inequalities (7), (8), and (9):

$22<T_{21}<610$ (10)

$-388<T_{32}<475$ (11)

$-168<T_{13}<430$ (12)

Inequality 12 may be rewritten in terms of T21 and T32:

$-168<-(T_{21}+T_{32})<430$ (12a)

By studying Inequalities 10, 11, and 12a, it can be inferred that the lower bounds are more critical than the upper bounds. A test solution can be obtained by equating the three lower margins ($T_2-22$ etc), giving a common value of 178. This can be shown to be an optimum solution. The values of the three differential times producing this result are then $$T_{21} = 200 \quad (13)$$

$$T_{32} = -210 \quad (14)$$

$$T_{13} = 10 \quad (15)$$

Converting the differential times $T_{ij}$ back to absolute delays and choosing D3 as reference yields the design values of clock skew:

$$D1 = 10 \quad (16)$$

$$D2 = 210 \quad (17)$$

$$D3 = 0 \quad (18)$$

The preferred embodiment incorporated only one flip-flop circuit in the shift register. However, alternative embodiments may use a shift register composed of multiple flip-flop circuits. Determining an optimum number of flip-flop circuits is straightforward. The method is to configure the shift register model with varying numbers of flip-flop circuits and then analyze each configuration as illustrated above. Although any number of flip-flop circuits could conceivably improve the speed of the divider, other practical constraints (power, complexity, cost, etc.) keep the number small. In addition, speed improvement diminishes with larger numbers of flip-flop circuits.

Figure 5:
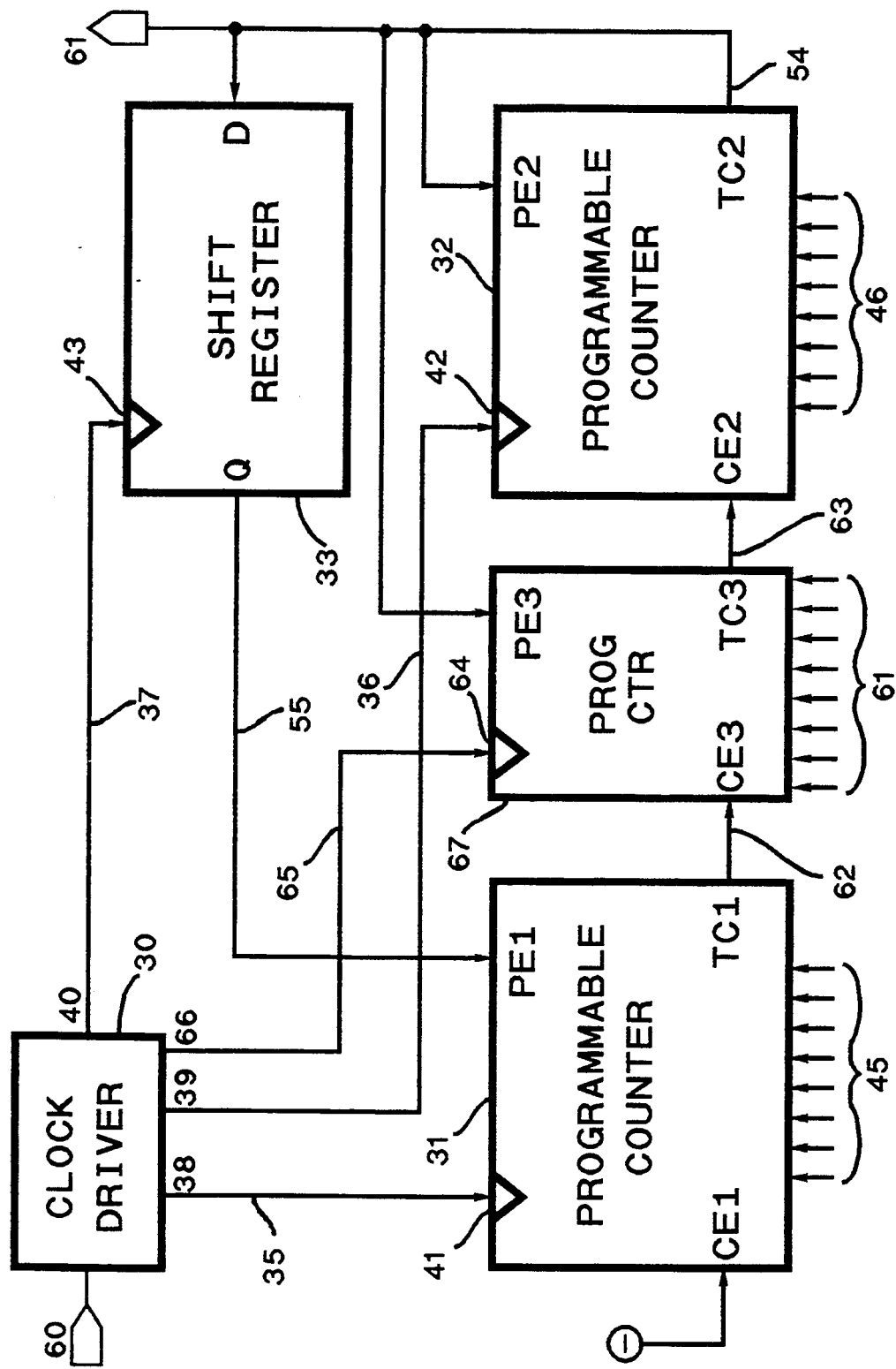
FIG. 5 is a block diagram of the divider of FIG. 2 showing the inclusion of a third programmable counter.

Two cascaded, programmable, 8-bit counters 31 and 32 were described above in the preferred embodiment, resulting in a maximum divider ratio of about $2^{16}$. To obtain a larger divider ratio, a third programmable counter may be cascaded between these counters, as illustrated in FIG. 5. Third counter 67 is cascaded between first counter 31 and second counter 32. This third counter has a clock input 64 connected by a trace 65 to an output 66 of clock drive 60. N-complement, the programmed integer divisor, is partitioned through program input 61. Program control input PE3 is connected to terminal count TC2. Count enable CE3 is connected to TC1 via line 62, and terminal count TC3 is connected to CE2 via line 63. In order to realize advantages of the invention, the time delay in trace 65 should be determined in the manner explained and illustrated above for the preferred embodiment.

Besides maximizing the design margins, as has been illustrated in this embodiment, another goal is achieving maximum frequency of operation. This is accomplished in a similiar manner. While positioning the choices of the $T_{ij}$ for best margins, one then reduces the value of T until the critical margin becomes zero. The inverse of T is then the maximum possible operating frequency.

| Symbols | list of symbols used in the specification: Significance |
|---|---|
| N | counting modulus of a cascaded divider |
| TC | terminal count: output provided by a counter when its internal registers are at maximum count |
| CE | count enable: control input to a counter which regulates advancing the internal registers |
| PE | program enable: control input to a counter which allows it to set the internal registers to the number applied to the program input |
| D1, D2, D3 | delay in clock signal edge applied to associated IC, w.r.t. the clock driver |
| $T_{ij}$ | differential clock times: Di–Dj |
| D7, D8, D9 | delay of the output signal of associated IC due to transit time and time constant effects |
| S1, S2, S3 | minimum setup time required by input of associated IC |
| H1, H2, H3 | minimum hold time required by input of associated IC |
| D4, D5, D6 | clock-to-output delay of associated IC |
| T | period of applied clock signal |

I have described and illustrated the principles of my invention with reference to a preferred embodiment; however, it will be apparent that the invention can be modified in arrangement and detail without departing from such principles. For instance, the shift register may be constructed of multiple flip-flops. Another alternative is to use decimal, rather than binary counters. It will be recognized that the detailed embodiment is illustrative only, and should not be taken as limiting the scope of my invention. Rather, I claim as may invention all such variations as may fall within the scope and spirit of the following claims and equivalent thereto.

I claim:

1. A programmable frequency divider for dividing a high frequency clock signal by an externally supplied digital integer, comprising:

a clock driver having an input coupled to the clock signal and a plurality of outputs, each output being delayed by a predetermined time with respect to the clock signal;

a first programmable counter having a clock input coupled to an output of the clock driver, a program input coupled to a least significant portion of the external integer, a control input for regulating the program input, and a terminal count output;

a second programmable counter having a clock input coupled to an output of the clock driver, a program input coupled to a most significant portion of the external integer, a control input for regulating the program input, a count enable input coupled to the terminal count output of the first counter, and a terminal count output coupled to the control input of the second counter;

a delay circuit having an input coupled to the terminal count output of the second counter, and an output coupled to the control input of the first counter.

2. A programmable frequency divider as recited in claim 1, further including a third programmable counter cascaded between the first and second programmable counters, the third counter having a clock input coupled to an output of the clock driver, a program input coupled to a portion of intermediate significance of the external integer, a control input, coupled to the second counter output, for regulating the program input, a count enable input coupled to the terminal count output of the first counter, and a terminal count output coupled to the count enable input of the second counter.

3. A programmable frequency divider as recited in claim 1, wherein the clock driver comprises a buffer with a plurality of essentially simultaneous buffered outputs, each buffered output being coupled to a clock driver output through a time delay element of predetermined value.

4. A programmable frequency divider as recited in claim 3, in which the time delay elements comprise electrical transmission lines with appropriate delay values.

5. A programmable frequency divider as recited in claim 4, in which the electrical transmission lines are printed circuit traces of appropriate lengths.

6. A programmable frequency divider as recited in claim 1, wherein the delay circuit comprises a shift register having at least one flip-flop circuit and a clock input coupled to an output of the clock drive.

7. A method for dividing a high frequency clock signal by a digital integer partitioned into first and second portions, the divider comprising first and second programmable counters and a clock driver having first, second, and third outputs, the method comprising the steps of:

a) connecting the first counter in cascade with the second counter;

b) programming the first counter with the first portion of the digital integer and programming the second counter with the second portion of the digital integer;

c) coupling the second counter to the first counter through a shift register circuit;

d) coupling the first clock driver output to the first counter through a coupling path having a first predetermined time delay;

e) coupling the second clock driver output to the second counter through a coupling path having a second predetermined time delay;

f) coupling the third driver output to the shift register circuit through a coupling path having a third predetermined time delay.

8. A method for dividing a high frequency clock signal by a digital integer, as recited in claim 7, wherein the predetermined time delays are determined to maximize the operating frequency of the divider.

9. A method for dividing a high frequency clock signal by a digital integer, as recited in claim 7, wherein the predetermined time delays are determined to maximize the design margins of the divider.

* * * * *